United States Patent [19]

Fukuda et al.

[11] Patent Number: 4,636,724

[45] Date of Patent: Jan. 13, 1987

[54] METHOD AND APPARATUS FOR EXAMINING ELECTROSTATIC DISCHARGE DAMAGE TO SEMICONDUCTOR DEVICES

[75] Inventors: Yasuhiro Fukuda; Ikuo Suganuma, both of Tokyo, Japan

[73] Assignee: Oki Electric Industry Co., Ltd., Tokyo, Japan

[21] Appl. No.: 653,921

[22] Filed: Sep. 24, 1984

[30] Foreign Application Priority Data

Sep. 30, 1984 [JP] Japan .................................. 58-180838

[51] Int. Cl.⁴ ............................................. G01R 31/26
[52] U.S. Cl. .................................. 324/158 R; 361/225
[58] Field of Search ...................... 324/158 R; 361/225

[56] References Cited

FOREIGN PATENT DOCUMENTS 4328743 12/1968 Japan ............................. 324/158 R
0080577 5/1982 Japan ............................. 324/158 R
0231458 12/1984 Japan ............................. 324/158 R Primary Examiner—Reinhard J. Eisenzopf
Assistant Examiner—Stephen M. Baker
Attorney, Agent, or Firm—Frishauf, Holtz, Goodman & Woodward

[57] ABSTRACT

A method and apparatus for examining the susceptibility of a semiconductor device to damage by discharge of electrostatic charge on a dielectric package of the device. The package is electrically charged, with an input or output pin of the device disconnected at least from a reference potential of the charging source. The input or output pin is then connected to the reference potential through a load impedance with the charging continued, to effect discharging of the charge on the package. Thus, the electrostatic breakdown voltage of the device can be determined with accuracy by testing of the device after each charging and discharging operation at successively higher charging potentials.

3 Claims, 14 Drawing Figures

METHOD AND APPARATUS FOR EXAMINING ELECTROSTATIC DISCHARGE DAMAGE TO SEMICONDUCTOR DEVICES

BACKGROUND OF THE INVENTION

This invention relates to a method and apparatus for examining electrostatic discharge damage to semiconductor devices, and more particularly to a method and apparatus of this kind, which can accurately determine the electrostatic discharge breakdown voltages of semiconductor devices enclosed in dielectric packages.

Conventionally, in handling IC devices, there often occurred accidents of sudden discharge of electrostatic charge of the mold packages, causing damage to insulating films within the devices. MOS IC devices in general are subjected to electrostatic breakdown tests for delivery, and only those ones which are found acceptable are delivered to users. However, in actual use or handling on the user side, even MOS IC devices found acceptable sometimes had dielectric breakdown and were sent back to the maker. Therefore, the appearance of a new testing method has been desired which is capable of accurately evaluating the susceptibility of semiconductor IC devices to such electrostatic discharge damage.

Typical conventional methods for examining electrostatic discharge damage to semiconductor IC devices include "the Human Body Model" and "the Charged Device Model".

FIG. 1 is a circuit diagram of a testing circuit for electrostatic discharge damage according to the Human Body Model which is employed in general. In the figure, the testing circuit comprises a direct-current voltage supply 1, a changeover switch SW1, an equivalent human body capacitance CD (e.g. 100-200 pF), an equivalent human body resistance RE, and a MOS IC device 2. The equivalent circuit of this MOS IC device is represented by an input protective resistance RI, an input protective diode D, and a capacitance Cox of a gate-insulating film of a MOS transistor. The MOS IC device 2 has an input or output pin terminal 2a connected to an end of the resistance RE, and a supply pin terminal 2b connected to ground.

In the testing operation, first the switch SW1 is connected to the voltage supply 1 to cause charging of the capacitance CD up to 250 volts, for instance. Then, the switch SW1 is switched over to the resistance RE to cause discharge currents I1 and I2 to flow through the IC device 2, as shown in FIG. 2, in such a manner that initially discharge current I1 takes place through the capacitance Cox, and thereafter Zener current I2 flows through the diode D. The above applied voltage from the direct current voltage supply 1 is evaluated to be a withstanding voltage of the MOS IC device 2.

This conventional testing method, however, does not give any consideration to the package capacitance Cp, and it is therefore difficult with this method to accurately determine the electrostatic breakdown voltage of the MOS IC device.

FIG. 3 shows a circuit diagram of a testing circuit for electrostatic discharge damage according to the conventional Charged Device Model which takes into account the package capacitance. In FIG. 3, a MOS IC device 2 comprises an input or output pin terminal 2a, a supply pin terminal 2b, and a metal plate 4 disposed in contact with a package surface of the device and having a ground potential level. In testing operation, the switch SW2 is closed, and at the same time the switch SW3 is opened, to thereby cause charging of the package capacitance Cp (e.g. 2-5 pF) up to a testing voltage. Next, the switch SW2 is opened, and simultaneously the switch SW3 is closed, to thereby cause discharging of the package capacitance Cp, followed by checking damage to the gate-insulating film capacitance Cox by the charged voltage of the package capacitance Cp. FIG. 4 shows transient discharge current I3 flowing through the gate-insulating film capacitance, and transient discharge current I4 flowing through the protective diode D in the circuit of FIG. 3.

According to this Charged Device method, however, since the package capacitance Cp is very small, a discharge current flow through the diode D in the forward direction, which takes place upon opening of the switch SW2 and simultaneous closing of the switch SW3, can cause a drop in the testing voltage applied to the gate-insulating film capacitance Cox. Therefore, it is difficult to accurately determine the electrostatic breakdown voltage of the IC device.

As stated above, testing results according to the conventional electrostatic discharge damage testing methods are not so accurate as to assure users of the reliability of the semiconductor devices found acceptable after testing.

SUMMARY OF THE INVENTION

It is therefore an object of the invention to provide a method and apparatus for examining electrostatic discharge damage to semiconductor devices, which is capable of accurately determining a breakdown voltage at which a semiconductor device can be damaged by discharge of electrostatic charge of a dielectric package thereof.

The present invention provides a method and apparatus for examining the susceptibility of a semiconductor device to damage by discharge of electrostatic charge of a dielectric package thereof. The method according to the invention comprises the following steps:

(1) electrically charging the package with an input or output pin of the semiconductor device disconnected at least from a reference potential source of the device;

(2) connecting the input or output pin of the device to the reference potential source through a load impedance means, while continuing the charging of the step (1), whereby the charge of the package is discharged to the reference potential source through the input or output pin of the device and the load impedance means; and (3) determining a voltage value at which the device has been damaged by the discharging of the step (2).

The apparatus according to the invention comprises:
charging means connected between a surface of a package of the device and a reference potential source, for electrically charging the package;
switch means having one terminal connected to an input or output pin of the device; and
load impedance means connected between the other terminal of the switch means and the reference potential source.

The switch means is closed to discharge the charge of the package, with the charging of the package continued.

The above and other objects, features, and advantages of the invention will be more apparent from the ensuing detailed description taken in conjunction with the accompanying drawings.

DETAILED DESCRIPTION

Figure 1:
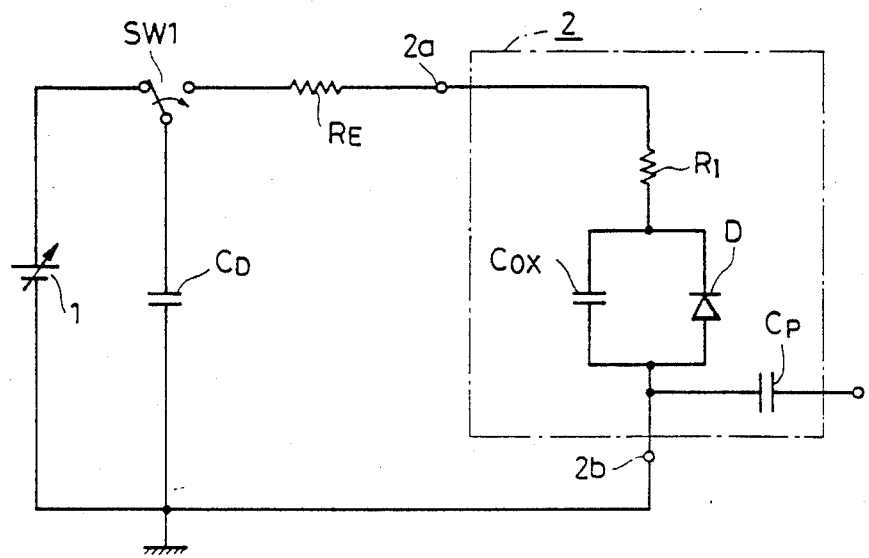
FIG. 1 is a circuit diagram of the equivalent circuit of an electrostatic discharge damage testing apparatus according to the conventional Human Body Model.
Figure 2:
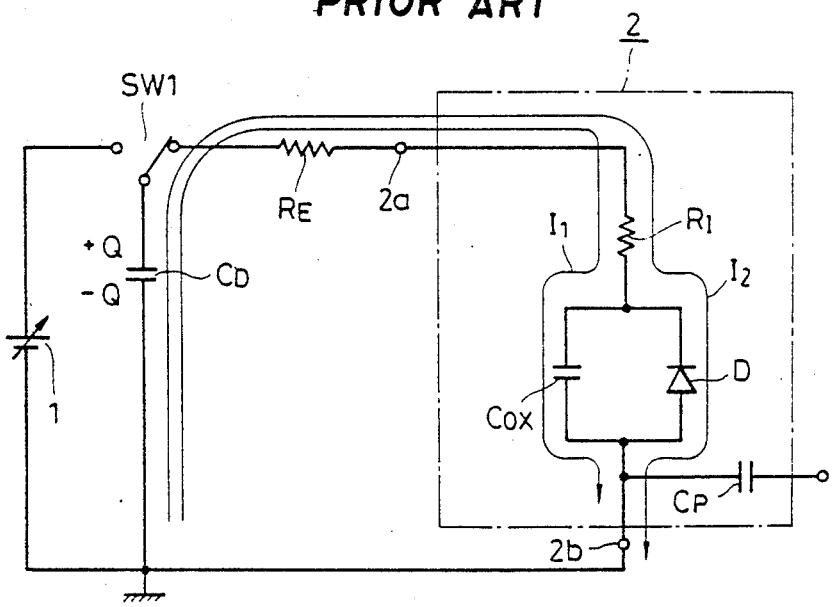
FIG. 2 shows current paths in the circuit of FIG. 1.
Figure 3:
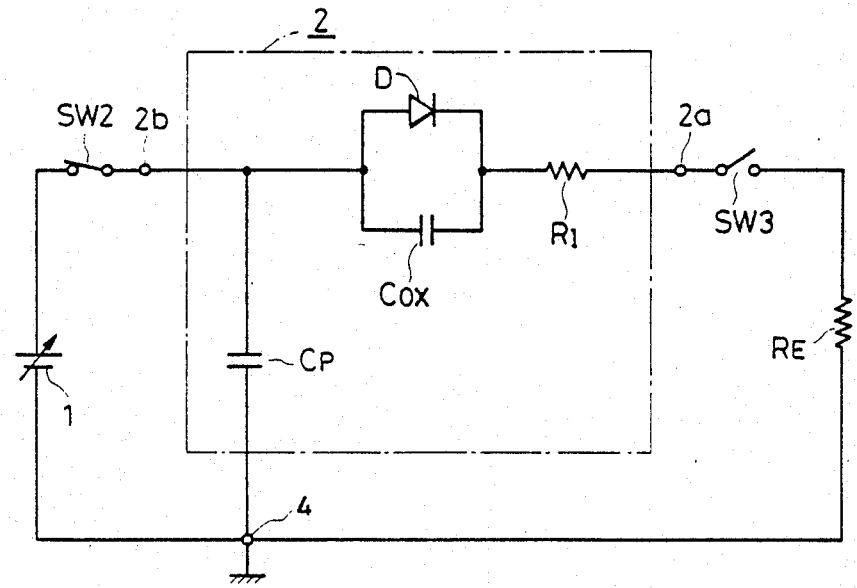
FIG. 3 is a circuit diagram of the equivalent circuit of an electrostatic discharge damage testing apparatus according to the conventional Charged Device Model.
Figure 4:
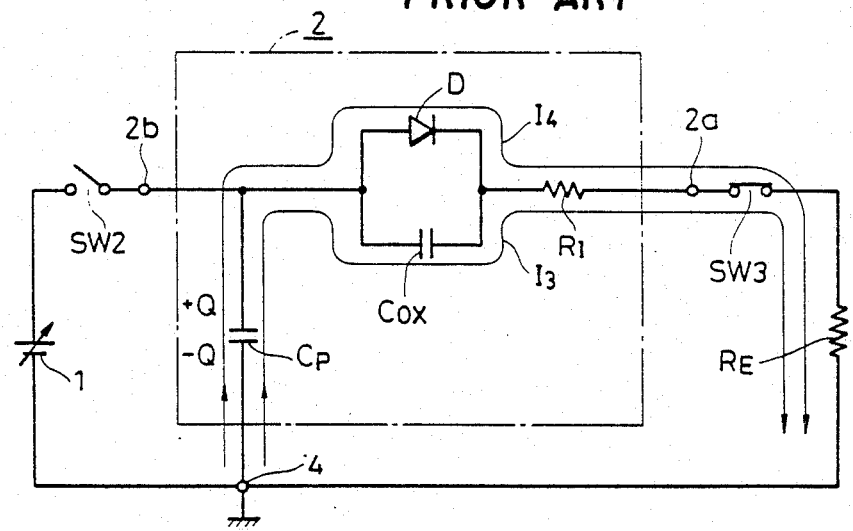
FIG. 4 shows current paths in the circuit of FIG. 3.
Figure 5:
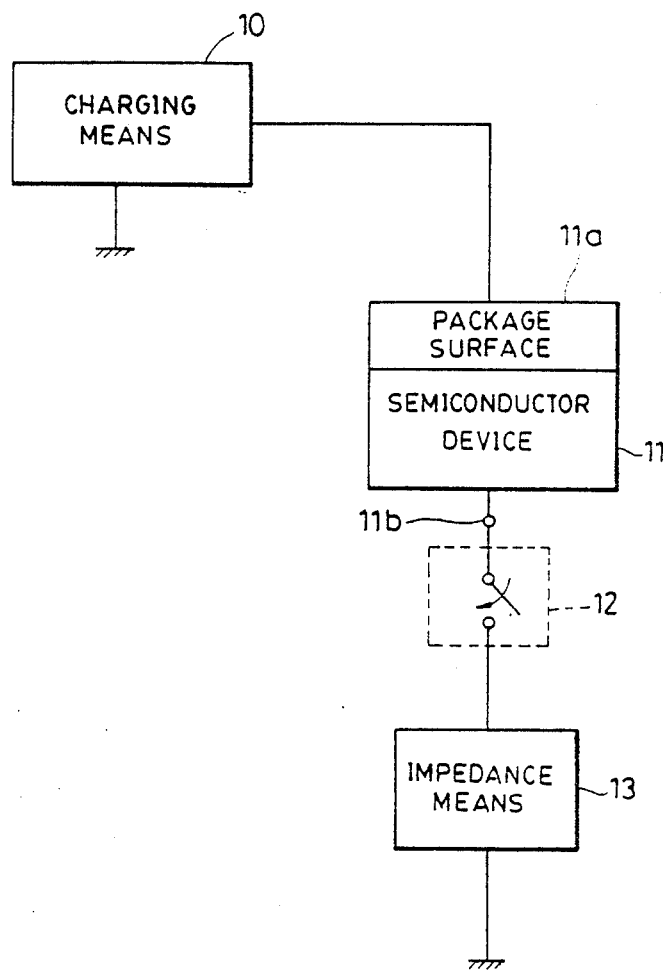
FIG. 5 is a block diagram of an electrostatic discharge damage testing apparatus according to the present invention.

Referring first to FIG. 5, there is shown in block diagram an electrostatic discharge damage testing apparatus of the present invention. In the figure, the apparatus according to the invention comprises a semiconductor device 11 to be tested, such as a MOS IC device, a charging means 10 disposed in contact with a major surface 11a of a dielectric package of the semiconductor device 11, for electrically charging the dielectric package, a load impedance 13 connected to a ground potential source, and a switch 12 connected between an input or output pin 11b of the semiconductor device 11 and the load impedance 13, for causing discharging of the static electricity charged in the dielectric package.

In operation, first the output voltage from the charging means 10 is elevated up to a predetermined voltage level to charge the package surface 11a. Next, the switch 12 is closed to cause discharging of the charged static electricity through the input or output pin 11b of the semiconductor device. Thereafter, it is checked whether or not there has occurred electrostatic discharge damage to the semiconductor device 11, by tesing electrical performance of the same device. By repeating the above charging step and discharging step at various different withstand voltages, it is possible to accurately determine the maximum withstanding voltage at which the semiconductor device can withstand electrostatic discharge. For instance, assuming that damage to the device 11 occurs immediately after an nth testing operation with a charged voltage Vn of the package surface 11a, it is decided that the maximum withstanding voltage of the semiconductor device against electrostatic discharge damage is (Vn−1+Vn)/2, wherein Vn−1 is a charged voltage of the package surface 11a obtained immediately after an (n−1)th testing operation, and Vn−Vn−1 is larger than 0. The smaller the value of difference $\Delta Vn = Vn - Vn - 1$, the more accurate the withstanding voltage value obtained.

Figure 6:
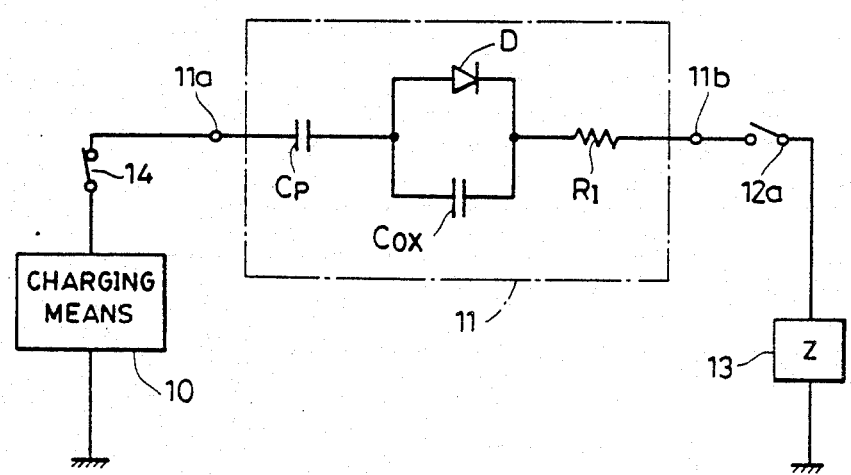
FIG. 6 is a circuit diagram of the equivalent circuit of the apparatus of FIG. 5.

FIG. 6 is a circuit diagram of the equivalent circuit of the testing apparatus of FIG. 5. In FIG. 6, the equivalent circuit of the MOS IC device is formed of an input protective diode D and an input protective resistance RI, a capacitance Cox of a gate-insulating film of a MOS transistor in the device or of a field-insulating film of a bipolar transistor, and a capacitance Cp of a dielectric or plastic package of the device. It is an important feature of the invention that the output voltage from the charging means 10 is applied to the package surface 11a.

The value of the load impedance 13 is set at a capacitance value of 200 pF if it is assumed that the electrostatic charge of the package is discharged to the human body through the pin 11b of the semiconductor device 11, and at a resistance value of 0 ohm by making a short across the means 13 if it is assumed that the electrostatic charge of the package is discharged to a metal body through the pin 11b body.

Figure 7:
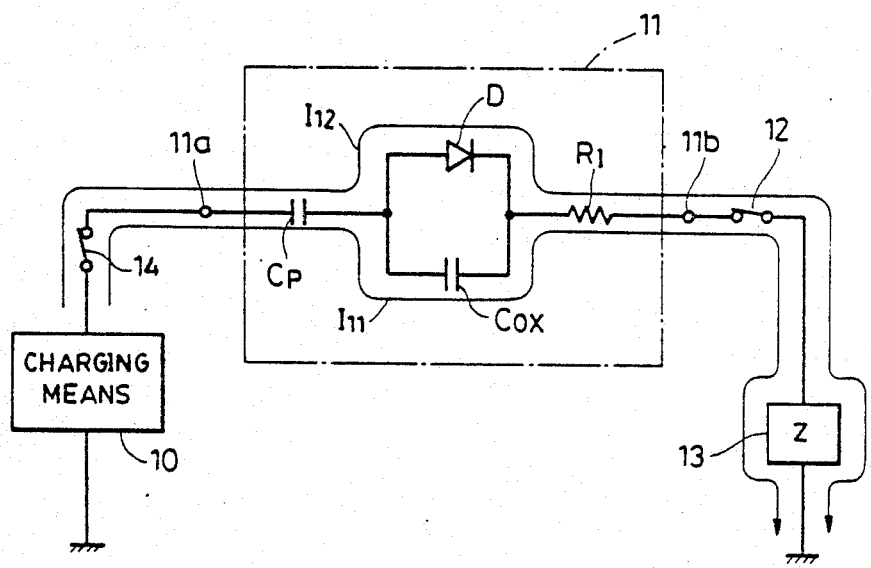
FIG. 7 shows current paths in the circuit of FIG. 6.

In operation, the switch 14 is closed, and then a predetermined charging voltage from the charging means 10 is applied to the package surface 11a to electrically charge the package. Thereafter, the switch 12 is closed while the charging is continued, and then the charged static electricity is discharged through the pin 11b and the load impedance 13. On this occasion, as shown in FIG. 7, initially transient current Il1 flows through the device, and thereafter transient current Il2 flows therethrough. After the discharging operation, the presence of damage to the semiconductor device 11 is checked to evaluate the susceptibility of the device to electrostatic discharge damage.

According to the arrangement of the invention, the charging operation into the package is continued even when the discharging operation is carried out, thereby enabling accurate determination of the electrostatic breakdown voltage.

Figure 8:
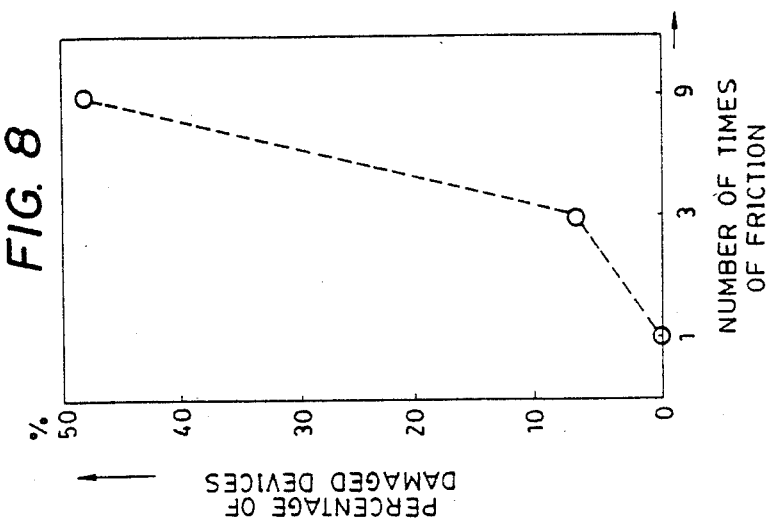
FIG. 8 is a graph showing the relationship between number of times of friction and percentage of occurrence of electrostatic discharge damage.

FIG. 8 shows the relationship between the number of times of friction of the package surfaces of MOS IC devices of a certain model and the percentage of occurrence of electrostatic discharge damage to the devices. The MOS IC devices were charged with static electricity by subjecting the package surfaces to friction by means of a rubber roller normally used in printing the model name during sealing step.

Figure 9:
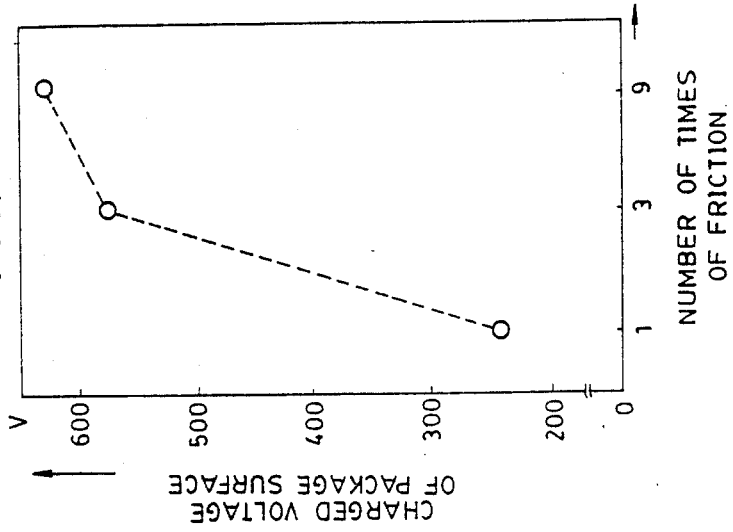
FIG. 9 is a graph showing the relationship between number of times of friction and charged voltage of the package surface.

FIG. 9 shows the relationship between the number of times of friction of the package surfaces of the MOS IC devices and the charged electrostatic voltage of the package surfaces of the MOS IC devices.

It will be learned from FIGS. 8 and 9 that if the package surface voltage exceeds approximately 600 volts, a sudden increase occurs in the percentage of devices damaged by the electrostatic discharge.

Table 1 given below shows average values of the electrostatic breakdown voltage as results of tests conducted on the MOS IC devices on the same lot according to the Human Body Mode, the Charged Device Mode, and the method of the present invention.

TABLE 1

| Method | Breakdown Voltage (x̄) |
|---|---|
| Human Body Model: | 250 v |
| Charged Device Model: | 1100 v |

TABLE 1-continued

| Method | Breakdown Voltage ($\bar{x}$) |
|---|---|
| Present Invention: | 620 v |

Number of sets of sample n = 30

Referring to Table 1 above and FIGS. 8 and 9, it will be learned that the average value of 620 volts as test results according to the invention is closest to the above value of 600 volts found critical from FIGS. 8, 9. From this fact, it will be understood that the method of the present invention can most accurately determine the electrostatic breakdown voltage of semiconductor devices subjected to discharge of electrostatic charge of the package surfaces.

TABLE 2

| IC Maker | Maker A | Maker B | Maker C |
|---|---|---|---|
| Percent of Devices Damaged during Sealing Electrostatic Breakdown Voltage | 64% | 2% | 0% |
| Human Body Model | 350 v | 220 v | 300 v |
| Charged Device Model | 950 v | 700 v | 1000 v |
| Present Invention | 700 v | 1400 v | 5000 v |

Number of sets of sample n = 30

Table 2 given above shows average values of the breakdown voltage of semiconductor devices of the same model manufactured by three makers A, B, and C, and percentage of devices damaged due to discharge of electrostatic charge of the package surfaces subjected to friction ten times, as results of breakdown tests using the aforementioned three methods. Since the percentage of damaged devices becomes smaller in the order of makers A, B and C in Table 2, properly the average value of the breakdown voltage should become larger in the order of makers A, B and C. According to Table 2, it is only the method according to the present invention that satisfies the above requirement of the order of makers. This fact also tells that the method according to the present invention is capable of most accurately determining the breakdown voltage by electrostatic discharge of the packages.

Figure 10:
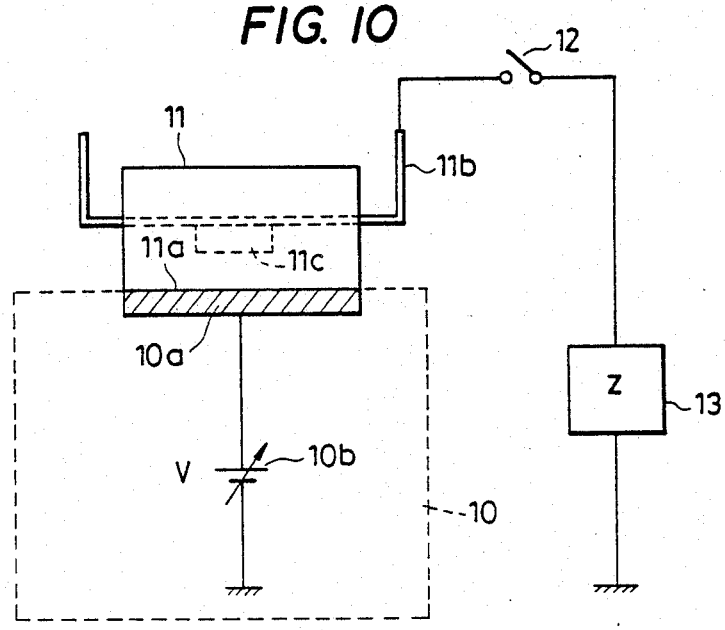
FIG. 10 is a schematic view showing a first embodiment of the apparatus according to the present invention.

A first embodiment of the apparatus according to the invention will now be described with reference to FIG. 10. In the first embodiment, a charging means 10 comprises a metal plate 10a disposed in contact with susbtantially the whole area of the package surface 11a, and a direct current voltage supply 10b connected between the metal plate 10a and ground potential. In FIG. 10, reference numeral 11c designates a semiconductor chip.

According to this embodiment, the charging voltage from the direct current voltage supply 10b is applied to the package surface 11a to a set guaranteeable voltage, so that the package is electrically charged over substantially the whole surface area thereof, to thereby enable simulation of a state of a semiconductor device frictionally charged with static electricity.

Figure 11:
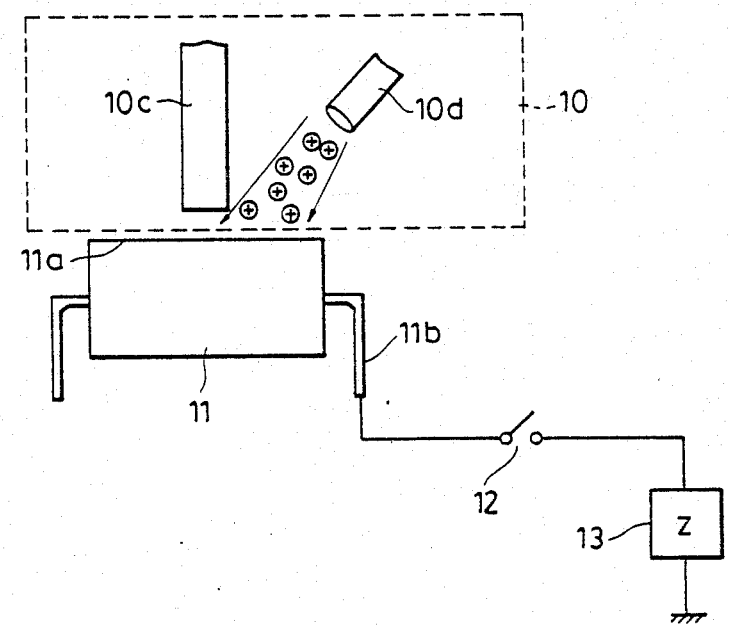
FIG. 11 is a schematic view showing a second embodiment of the apparatus according to the invention.

FIG. 11 shows a second embodiment of the invention. The charging means 10 comprises a corona discharge device 10d for generating ion beams.

According to this embodiment, the potential of the package surface 11a can be positively held at a set guaranteeable value (which is checked by means of a surface potential meter 10c) by adjusting the amount of ion beams radiated against the package surface 11a.

Figure 12:
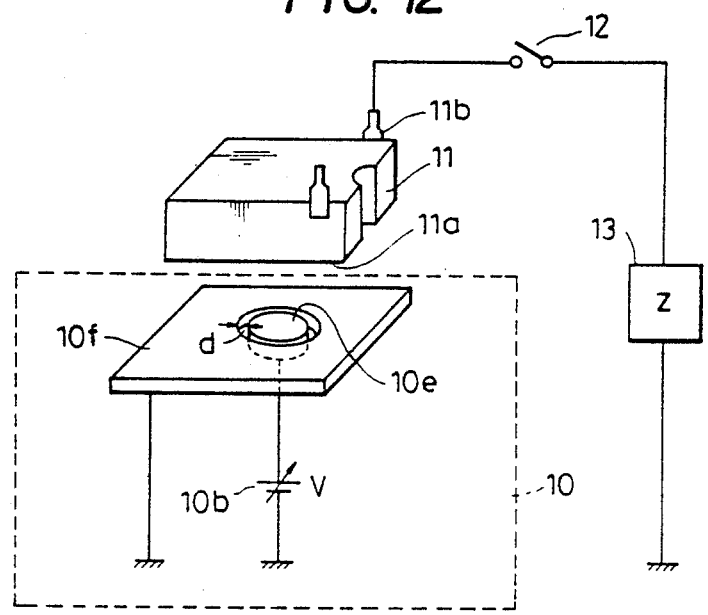
FIG. 12 is a schematic view showing a third embodiment of the apparatus according to the invention.

FIG. 12 shows a third embodiment of the invention, in which the charging means 10 comprises a first metal plate 10e disposed in contact with a selected portion of the package surface 11a, and a second metal plate 10f disposed in contact with the other part of the package surface 11a, and a direct current voltage supply 10b connected between the first metal plate 10e and the second metal plate 10f. In the figure, the distance d between the first and second metal plates 10e, 10f is set at such a value that no discharge can take place between the two plates.

According to this embodiment, only the potential of the selected portion of the package surface 11a in contact with the first metal plate 10e is locally charged to a set guranteeable voltage, to thereby enable testing a phenomenon of discharge damage caused by local charging of the package surface 11a.

Figure 13:
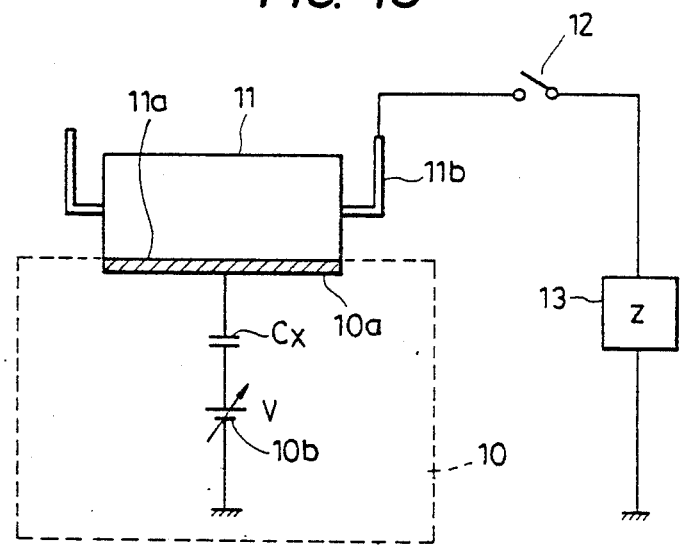
FIG. 13 is a schematic view showing a fourth embodiment of the apparatus according to the invention.

FIG. 13 shows a fourth embodiment of the invention, in which the charging means 10 comprises a metal plate 10a disposed in contact with substantially the whole area of the package surface 11a, a direct current voltage supply 10b, and a capacitor $C_X$ having an equivalent ground capacitance which is equal to a distributed or stray capacitance present between the major surface of the package 11 of the semiconductor device and ground, connected at one end to the metal plate 10a, and at the other end to the positive electrode of the charging supply 10b.

According to this embodiment, the quantity Q of charge of the package capacitance Cp can be calculated indirectly from the capacitance value of the capacitance Cx, thereby enabling an estimate of a phenomenon of electrostatic discharge damage to the semiconductor device depending upon the parameter Q.

Figure 14:
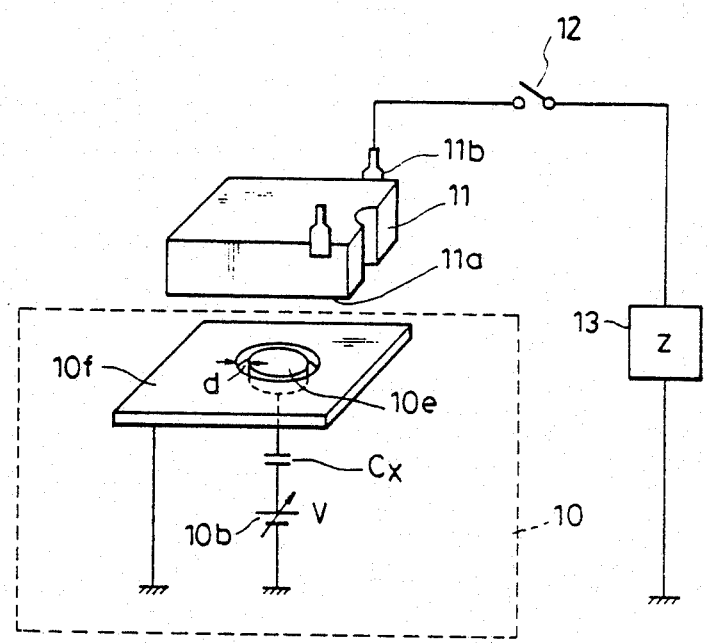
FIG. 14 is a schematic view showing a fifth embodiment of the apparatus according to the invention.

FIG. 14 shows a fifth embodiment of the invention, in which the capacitor $C_X$ is interposed between the first metal electrode 10e and the charging supply 10b.

Further, in the foregoing embodiments of the invention, a thin insulating plate, not shown, may be interposed between the metal plate 10a, 10e and the package surface 11a, to prevent spark discharge between a pin of the semiconductor device 11 and the metal plate, thereby permitting a breakdown test using a high electrostatic voltage.

Still further, a dielectric breakdown test according to the invention can also be applied to determination of the dielectric package capacity Cp in an indirect manner, making it possible to estimate the electrostatic breakdown voltage in designing the package.

What is claimed is:

1. In apparatus for examining the susceptibility of a semiconductor device having a dielectric package and an input or output pin, to damage by discharge of electrostatic charge on the package of said device, the apparatus including
    charging means connected between a surface of the package of the device and a reference potential, for electrically charging said package;
    switch means having one terminal connected to the input or output pin of said device; and
    load impedance means connected between the other terminal of said switch means and said reference potential,
    wherein said switch means is closed to discharge the charge on the package with the charging of the package continued, the improvement comprising:
    said charging means includes a first metal plate disposed in contact with a selected part of a major surface of said package, a second metal plate disposed in contact with another part of said major surface and spaced from said first metal plate by a predetermined distance, and a direct current voltage supply connected between said first metal plate and said second plate, and wherein said direct current voltage supply includes means for providing a variable output voltage.

2. In apparatus for examining the susceptibility of a semiconductor device having a dielectric package and an input or output pin, to damage by discharge of electrostatic charge on the package of said device, the apparatus including charging means connected between a surface of the package of the device and a reference potential, for electrically charging said package;

switch means having one terminal connected to the input or output pin of said device; and load impedance means connected between the other terminal of said switch means and said reference potential, wherein said switch means is closed to discharge the charge on the package with the charging of the package continued, the improvement comprising:

said charging means comprises a metal plate disposed in contact with a major surface of said package over substantially a whole area thereof, a capacitor having a capacitance corresponding to a distributed capacitance between said major surface and said reference potential and having one end connected to said metal plate, and a direct current voltage supply connected between the other end of said capacitor and said reference potential; and wherein said direct current voltage supply includes means for providing a variable output voltage.

3. In apparatus for examining the susceptibility of a semiconductor device having a dielectric package and an input or output pin, to damage by discharge of electrostatic charge on the package of said device, the apparatus including charging means connected between a surface of the package of the device and a reference potential, for electrically charging said package;

switch means having one terminal connected to the input or output pin of said device; and load impedance means connected between the other terminal of said switch means and said reference potential, wherein said switchmeans is closed to discharge the charge on the package with the charging of the package continued, the improvement comprising:

said charging means comprises a first metal plate disposed in contact with a selected part of a major surface of said package, a second metal plate disposed in contact with another part of said major surface and spaced from said first metal plate by a predetermined distance, said second metal plate being connected to said reference potential source, a capacitor having a capacitance corresponding to a distributed capacitance between said major surface and said reference potential and having one end connected to said first metal plate, and a direct current voltage supply connected between the other end of said capacitor and said reference potential; and wherein said direct current voltage supply includes means for providing a variable output voltage.

* * * * *